(12) United States Patent
Roberts

(10) Patent No.: US 7,408,401 B1
(45) Date of Patent: Aug. 5, 2008

(54) VACUUM TUBE REPLACEMENT DEVICE, CIRCUIT AND SYSTEM

(75) Inventor: Douglas H. Roberts, Bellevue, WA (US)

(73) Assignee: Roberts Retrovalve, Inc., Bellevue, WA (US)

( * ) Notice: Subject to any disclaimer, the term of this patent is extended or adjusted under 35 U.S.C. 154(b) by 40 days.

(21) Appl. No.: 11/678,562

(22) Filed: Feb. 23, 2007

(51) Int. Cl.
*H03F 5/00* (2006.01)
(52) U.S. Cl. .......................................... 330/3; 330/49
(58) Field of Classification Search .................. 330/3, 330/4.6, 41, 42, 43, 44, 49
See application file for complete search history.

(56) References Cited

U.S. PATENT DOCUMENTS

| | | | |
|---|---|---|---|
| 2,056,852 A * | 10/1936 | Hayden | 381/94.6 |
| 2,077,550 A * | 4/1937 | Dalpayrat | 330/64 |
| 2,881,266 A * | 4/1959 | Miller | 330/68 |
| 2,960,661 A * | 11/1960 | Bratschi | 330/127 |
| 3,345,468 A * | 10/1967 | Schlatter | 360/66 |
| 3,742,261 A | 6/1973 | Schneider et al. | 307/304 |
| 4,143,323 A | 3/1979 | Cieslak et al. | 340/653 |
| 4,809,336 A | 2/1989 | Pritchard | 381/61 |
| 4,864,245 A | 9/1989 | Kasha | 330/65 |
| 4,995,084 A | 2/1991 | Pritchard | 379/94 |
| 5,208,548 A | 5/1993 | Van Riezen | 330/59 |
| 5,434,536 A | 7/1995 | Pritchard | 327/599 |
| 5,636,284 A | 6/1997 | Pritchard | 381/61 |
| 5,648,664 A | 7/1997 | Rough et al. | 257/135 |
| 5,705,950 A | 1/1998 | Butler | 330/3 |
| 5,761,317 A | 6/1998 | Pritchard | 381/61 |
| 2002/0109544 A1 | 8/2002 | Butler | 330/3 |
| 2006/0018085 A1 | 1/2006 | Kelly | 381/120 |
| 2006/0176046 A1 | 8/2006 | Walker | 324/142 |

* cited by examiner

*Primary Examiner*—Henry K Choe
(74) *Attorney, Agent, or Firm*—Brett Hertzberg; Merchant & Gould PC

(57) ABSTRACT

A system is provided for a solid-state implementation of a vacuum tube replacement device. The system may derive power from a target amplifier filament supply. The system may include active or passive functions for noise reduction, voltage isolation, servo biasing, and other functions. The vacuum tube replacement device is pin-for-pin compatible with standard vacuum tube circuit pin configurations. The vacuum tube replacement device system architecture is equally useful for non-vacuum tube systems such as audio amplifier circuits.

54 Claims, 16 Drawing Sheets

VACUUM TUBE REPLACEMENT DEVICE, CIRCUIT AND SYSTEM

FIELD OF THE INVENTION

The present disclosure generally relates to solid state systems, circuits and devices that may be used to replace vacuum tubes, such as pin-for-pin compatible devices. Such devices may be employed in audio amplifiers including guitar/musical instrument amplifiers, hi-fi amplifiers, and any application circuit that may benefit from such replacement devices.

BACKGROUND

Glass vacuum tubes have been widely used in audio applications such as amplification of musical instruments as well as hi-fidelity reproduction. Although solid-state circuit technology has also been developed for use in such audio applications, vacuum tubes are still being used in some audio applications. Modern audio applications often use vacuum tubes for their acoustic properties, as well as their esthetic appeal.

The quality control effort associated with traditional vacuum tube devices is inevitably subject to less efficient production standards as compared to a solid-state solution. Traditional vacuum tube devices include a glass surround that is vacuum-sealed to a socket base similar to a light bulb. Inside the glass surround, a complex structure of metal plates, filaments, and other metal plated material arrangements are necessary to provide the proper function of the vacuum tube. Vacuum tube devices are prone to mechanical failure similar to light bulbs, where the filament materials eventually break due to mechanical failure. They are also prone to vacuum leaks and wear out which may reduce cathode emission.

Solid-state technology has been acknowledged for cost, performance, manufacturability, and/or other advantages over glass vacuum tubes. Solid-state devices can be significantly less expensive to manufacture, smaller in size, less prone to mechanical failures.

The present disclosure describes a system architecture for a vacuum tube-replacement-structure that utilizes solid-state circuits to provide the functions normally provided by the vacuum tube device. The described solid-state circuits can be used to effectively emulate the functions of vacuum tubes as pin-for-pin compatible vacuum tube replacement devices (VTRDs). As will be further described, the described system, circuits, devices, and/or partitions thereof may also be useful in other non-vacuum tube replacement applications.

BRIEF DESCRIPTION OF THE DRAWINGS

Non-limiting and non-exhaustive embodiments are described with reference to the following drawings.

DETAILED DESCRIPTION

Figure 1:
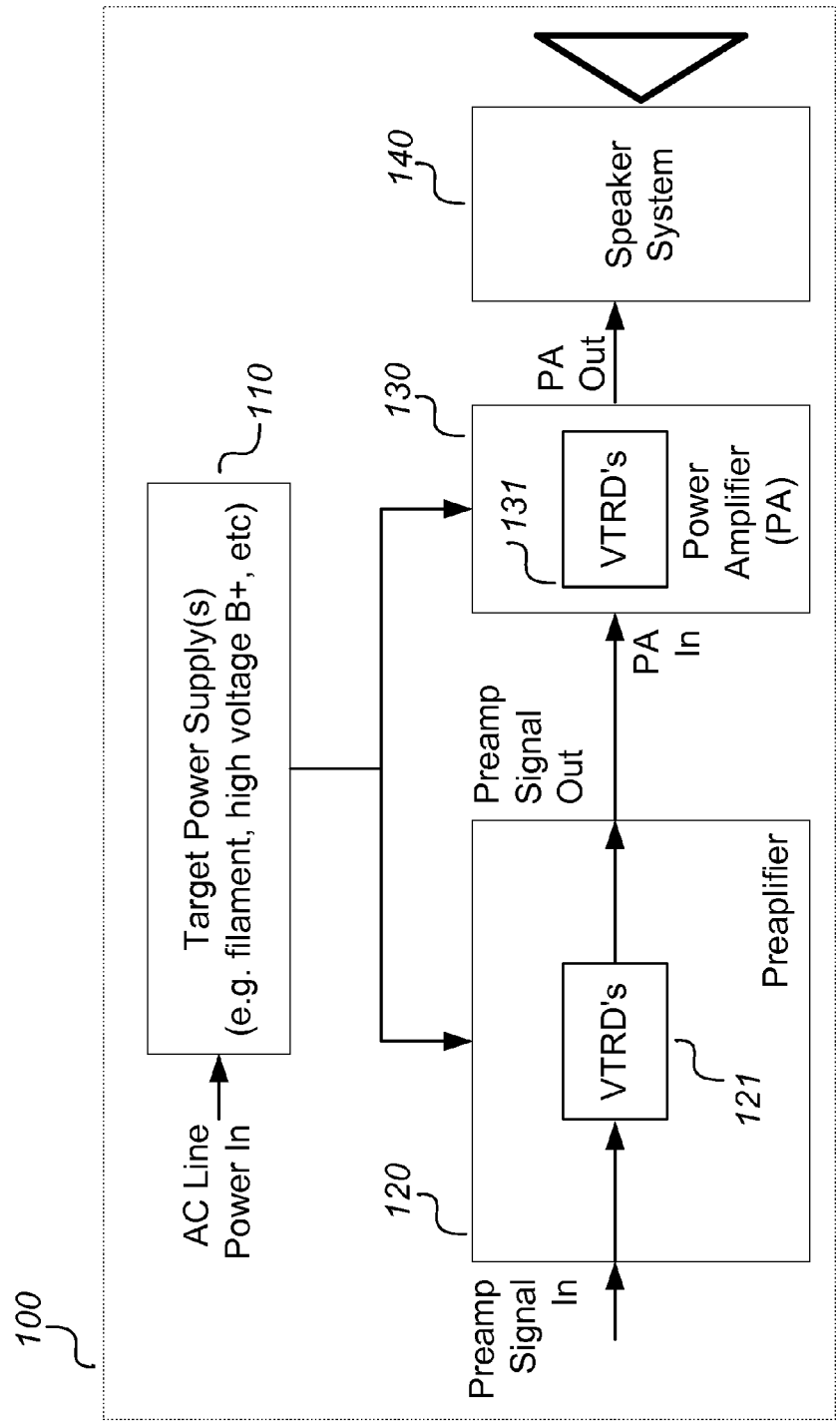
FIG. 1 is a block diagram of an example target amplifier system in which vacuum tubes or vacuum tube replacement devices (VTRDs) may be employed.

Various embodiments will be described in detail with reference to the drawings, where like reference numerals represent like parts and assemblies throughout the several views. Reference to various embodiments does not limit the scope of the present disclosure, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary there between. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to a systems, circuits, and devices for replacing a vacuum tube with a solid-state vacuum tube replacement-structure or device (VTRD). The VTRD is used to emulate the functionality of an electron vacuum tube. The VTRD can be configured as pin-for-pin compatible with standard vacuum tube devices such as triodes and pentodes, with pin base arrangements such as octal 7-pin, octal 8-pin, Noval B9A, or other styles to name a few. Each pin of an example VTRD may be arranged to function in a standard vacuum tube pin configuration such as, for example, one or more: plate, grid, cathode, and filament connections. The vacuum tube pin configurations may be for preamplifier vacuum tubes, power amplifier vacuum tubes, as well as combined preamplifier/power amplifier vacuum tubes. Example preamplifier vacuum tubes include styles such as: 12AX7, 12AT7, 12AU7, 6922, 7025, 6CG7, etc. Example power amplifier vacuum tubes include styles such as: EL34, EL84, 6L6, 6V6, 6550, 5881, KT66, KT88, etc. The VTRD is also equally useful in non-vacuum tube replacement applications such as audio amplifier circuits.

FIG. 1 is an illustration of an example amplifier system (100), which may be configured to use vacuum tubes, VTRDs, or a combination thereof. The example amplifier system (100) includes a power supply (110), which may include a high voltage B+ supply (e.g., 150V to 400V typical), and a low voltage filament supply for delivering power to the vacuum tube heaters (e.g., 6.3V to 12.6V AC or DC typical). The example amplifier system (100) also includes a preamplifier circuit (120) that is coupled to a power amplifier circuit (130), where either of the preamplifier and power amplifier circuits may employ vacuum tubes and/or VTRDs (e.g., 121 and 131) for amplification functions and auxiliary support. The power amplifier circuit (130) is illustrated as coupled to a speaker system (140) for acoustic output, but can configured to provide any other desired variety of output signal. The various functional and/or physical partitions illustrated by FIG. 1 are merely one example system, and the various partitions may be separated or integrated into one or more different physical and/or functional partitions than those depicted.

In operation, amplifier system 100 is arranged to operate as follows below. An external power source (not shown) is coupled to the power supply circuit (110) such as via AC Line Power In. The power supply circuit (110) is configured to receive input power from AC Line Power In and provide all necessary power conditioning functions such as rectification, regulation, filtering, etc. The outputs from the power supply circuit (110) correspond to all necessary AC and/or DC power signals, both high voltage and low voltage, which are required for proper operation of the preamplifier circuit (120) and the power amplifier circuit (130). An audio input signal is coupled to an input of the preamplifier circuit (120) as Preamp Signal In. The preamplifier circuit (120) is arranged to provide amplification of Preamp Signal In to provide Preamp Signal Out. The preamplifier circuit (120) may also be arranged to provide other signal processing functions to Preamp Signal In such as equalization, filtering, clipping, limiting, etc. Preamp Signal Out is coupled to an input (e.g., PA In) of the power amplifier circuit (130). The power amplifier circuit (130) is arranged to increase the signal levels (e.g., voltage and or current magnitudes) from PA In to provide for adequate signal levels to drive an output (e.g., PA Out).

Preamp Signal In can be provided from any variety of audio input sources such as pre-recorded audio input sources or a live audio input source. Example pre-recorded audio sources include CD players, cassette tape players, audio receivers, computer based hard disk drive recordings, to name a few. Example live audio input sources include microphones, magnetic coil and piezo-electric pickup devices, electronic instrument line level signals (e.g., keyboard outputs), as well as electronic devices that may process signals from such live audio input sources (e.g., signal processors, analog effects, digital effects, pre-amplifiers, etc.)

Figure 2A:
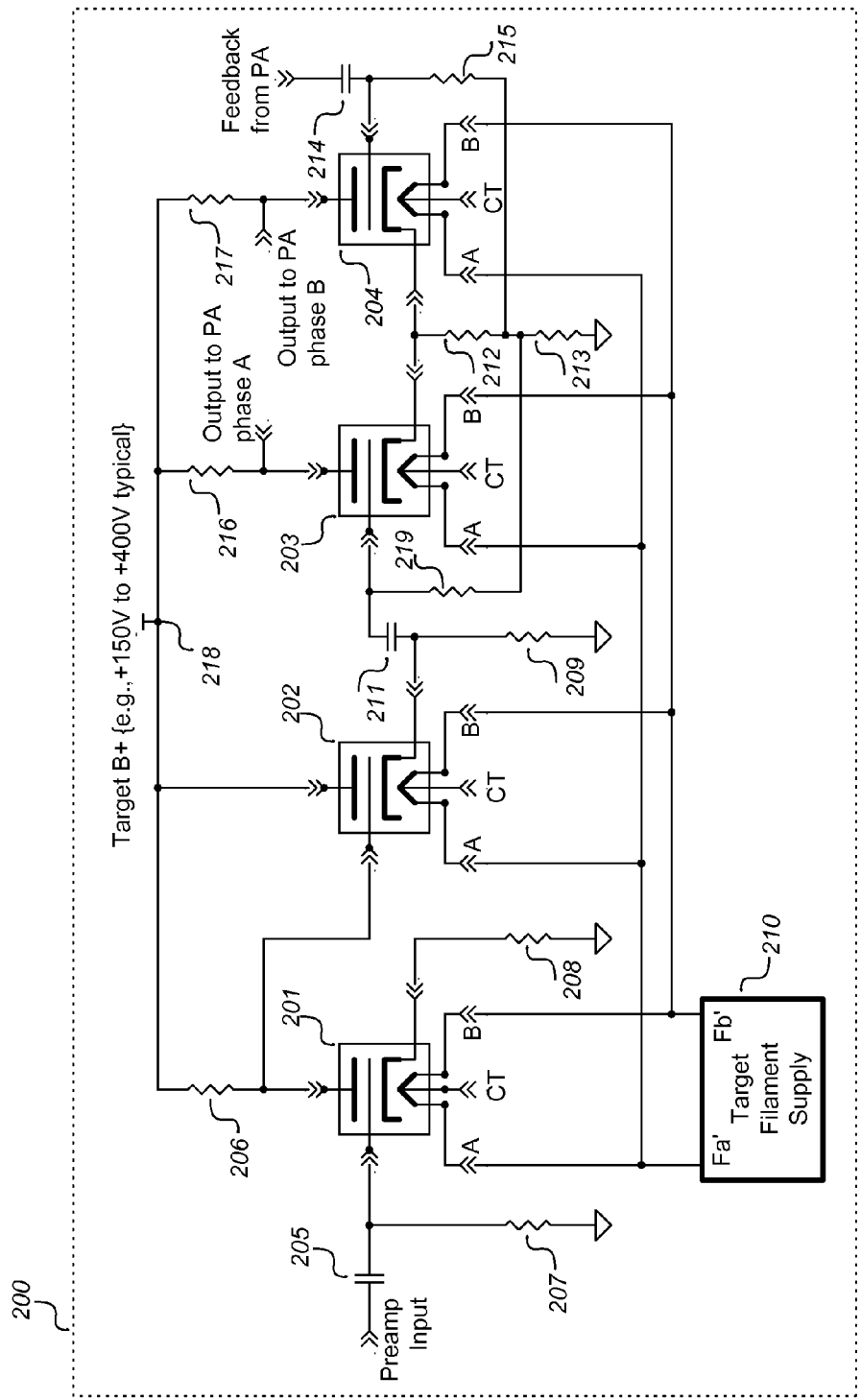
FIGS. 2A and 2B illustrate an example target preamplifier circuit using vacuum tubes and replacement of the vacuum tubes with VTRDs.
Figure 2B:
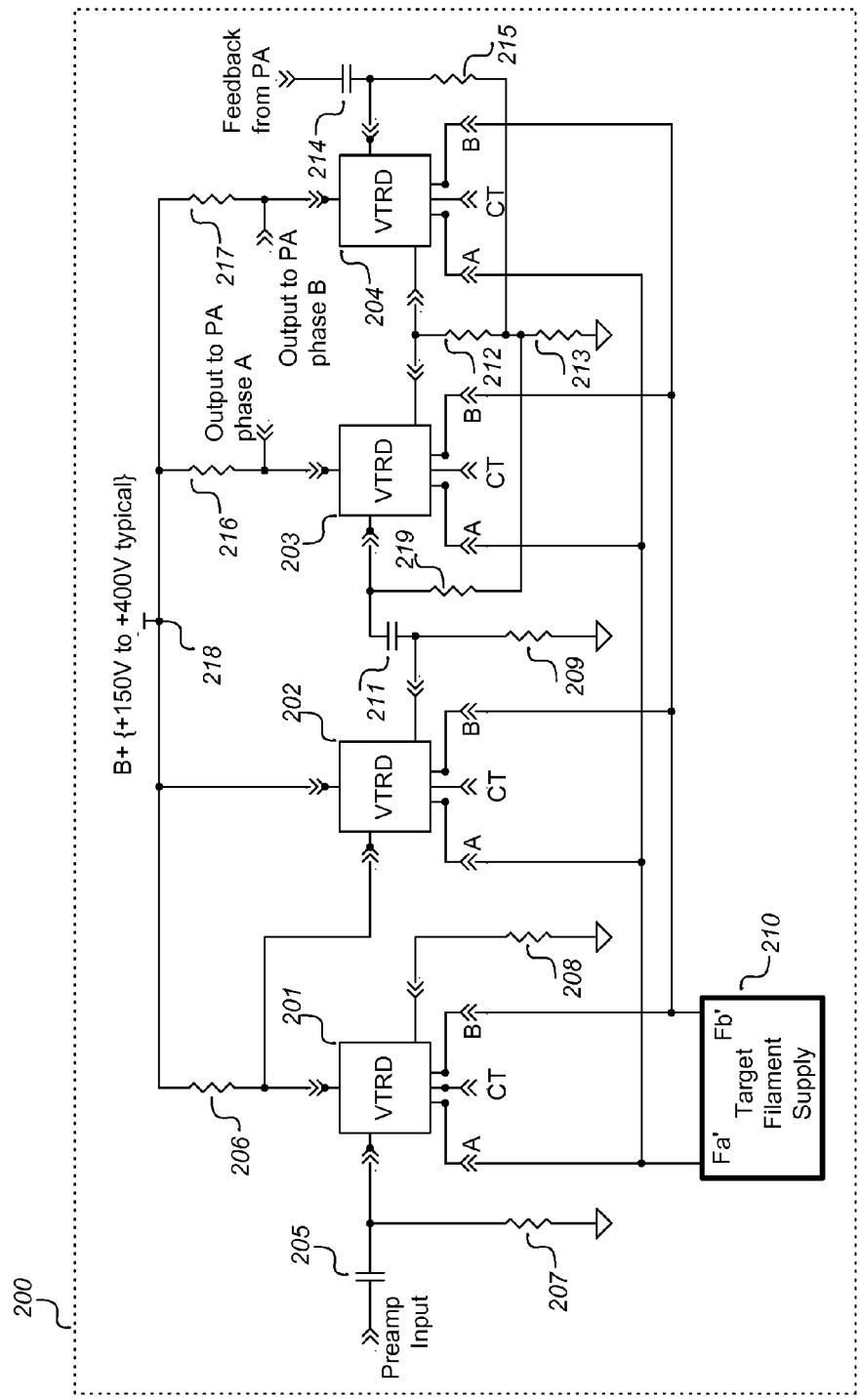

FIGS. 2A and 2B are an illustration of an example preamplifier circuit using vacuum tubes (200), which are then replaced with VTRDs (200'). The preamplifier circuit (200) employ's a first gain stage, a unity gain follower stage, and a phase inverter stage. The first gain stage includes a first vacuum tube (201) that is configured to provide a first gain to a preamp input signal (Preamp Input) according to gain that is determined in part by resistors 206 and 208, and ac coupled via capacitor 205. The unity gain follower stage includes a second vacuum tube (202) that is configured to operate as a cathode follower with resistor 209 to provide an output signal that is responsive to signals from the first gain stage (i.e., a cascade amplifier arrangement). The phase inverter stage includes vacuum tubes 203 and 204, arranged to operate with resistors 212, 213, 215, 216, 217 and 219, and responsive to signals from the unity gain follower stage which are ac coupled via capacitor 211. The phase inverter stage employ's two gain/mixing elements (e.g., the arrangement of vacuum tubes 203 and 204) operating in a differential arrangement, where they may be configured to include a corrective feedback means to enhance the linearity of the delivered signal output from the target amplifier. The phase inverter stage will have two signal outputs, which are 180 degrees out-of-phase from each other (e.g., Phase A and Phase B) for driving a push/pull power amplifier. Feedback from the power amplifier can be AC coupled to the phase inverter stage such as via capacitor 214. A filament supply circuit (210) provided by the target amplifier system can be used to supply power to the A and B filament terminals for each vacuum tube (201-204), which are depicted as coupled together in parallel in this example circuit (the center-taps (CT) are not used in the example topology). The B+ or plate supply power (218) for vacuum tube operation is derived from the target amplification system.

FIG. 2B is substantially the same as FIG. 2A, where each of the vacuum tubes (201-204) are replaced with pin-for-pin compatible VTRDs. FIGS. 2A and 2B are merely one example circuit topology that may be employed as a preamplifier circuit. Preamplifier (and power amplifier) circuit topologies and associated component types and values vary widely across target amplifier manufacturers, in addition to those component values changing based on manufacturer design revisions, and by modifications that are made by end-users.

Figure 3:
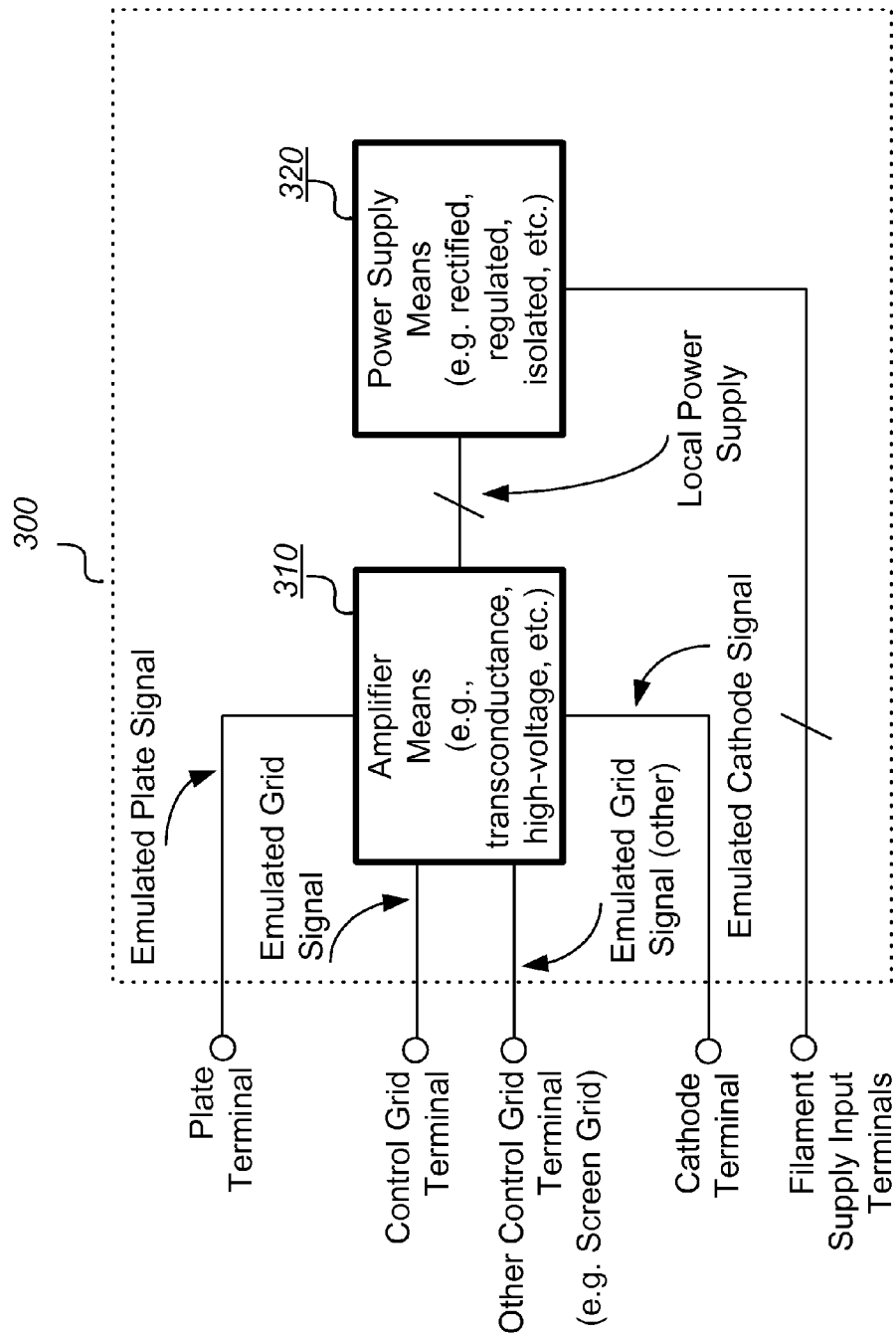
FIG. 3 illustrates the functional and/or physical partitions in an example VTRD system.

FIG. 3 is an illustration of functional and/or physical partitions in an example VTRD system (300), which includes a VTRD power supply means (320) coupled to a VTRD amplifier means (310). The VTRD power supply means (320) may derive input power from a filament supply via the filament supply input terminals in a target amplification system (e.g., 100). Example filament supplies typically provide filament voltage that range from 6.3V to 12.6V AC or DC. The VTRD power supply means (320) is arranged to provide local power supply signals generated from the filament power that can be utilized by the VTRD amplifier means (310). As will further be described, the VTRD power supply means (320) may optionally be isolated from the VTRD amplifier means (310). Example operating functions for the VTRD power supply (320) includes rectification, regulation, filtering, as well as other functions.

The VTRD amplifier means (310) may be a high voltage transconductance amplifier or some other type of amplifier which includes emulated plate, grid, cathode (return), and optional screen grid control terminals. Typical plate voltages range from 150V to 400V DC, which may be derived from a B+ supply in a target amplifier system (e.g., 100). The voltages described above are intended to serve merely as a reference since other VTRD amplifier implementations may operate at higher or lower plate voltages. The emulated-plate output from the VTRD amplifier means (310) will typically have parasitic load capacitance values below 20 pF, which may present an increased demand on the solid-state emulation circuit topology.

The control grid input to the VTRD amplifier means (310) will typically have parasitic capacitance values below 20 pF and input impedance values above 10 MΩ. In one example embodiment, the VTRD amplifier means (310) may also include a screen control grid for emulation of pentode type vacuum tube arrangements.

As will be demonstrated in detail throughout this disclosure, several functional benefits can be realized from the topology employed by the example VTRD system (300), which comprises the VTRD amplifier system (310) deriving isolated power independent of the target amplifier B+ supply. On such benefit is the reduction of noise or hum typically resulting as an artifact of the 60 cycle (60 Hz) AC power line (for US power lines). Another example benefit is expanded selection of off-the-shelf components for the VTRD amplifier means (310). Still another example benefit is an expanded dynamic output operating range for resistive and other types of loads. Additional benefits may be realized such as the ability to incorporate active compensation and other active circuit functionality in the VTRD amplifier means (310), including servo-biasing techniques, which is discussed in detail hereafter.

Figure 4:
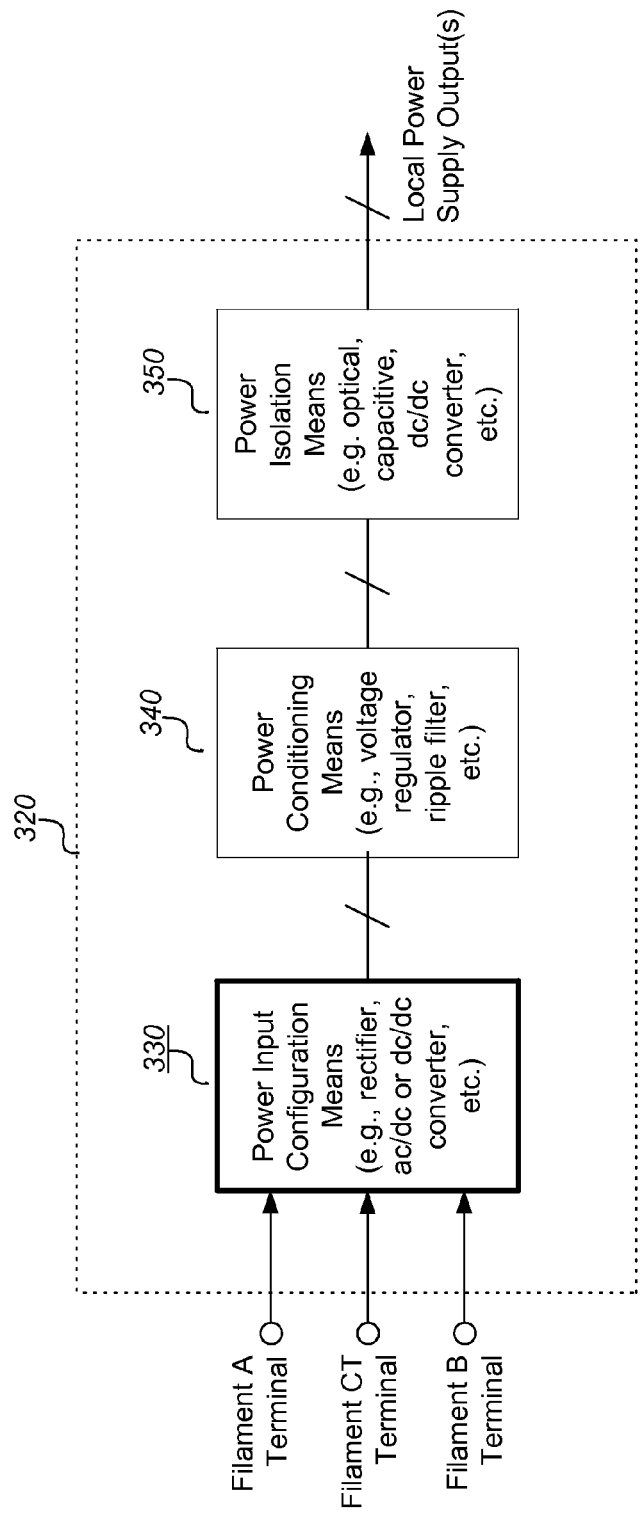
FIG. 4 illustrates an example of functional and/or physical partitions for a VTRD power supply means.

FIG. 4 illustrates an example VTRD power supply means (320), which includes a VTRD power input configuration means (330) coupled to a VTRD power conditioning means (340). The VTRD power conditioning means (340) may be coupled to a VTRD power isolation means (350), which is configured to deliver power to the VTRD amplifier (e.g. 310). The VTRD power input configuration means (330) may derive input power from a filament supply in a target amplifier circuit (e.g., 100), which may include a filament-A input, a filament-B input, and/or a filament center tap (CT).

The VTRD power input configuration means (330) may include a means for rectifying AC filament input power (e.g., rectifier, AC/DC converter, etc.) or utilizing DC filament input power (e.g., dc/dc converter, voltage divider, etc.). VTRD power supply means 320 may include LED's or other indicating means for indicating the presence of DC or AC filament power such as from the target amplifier system.

Figure 10A:
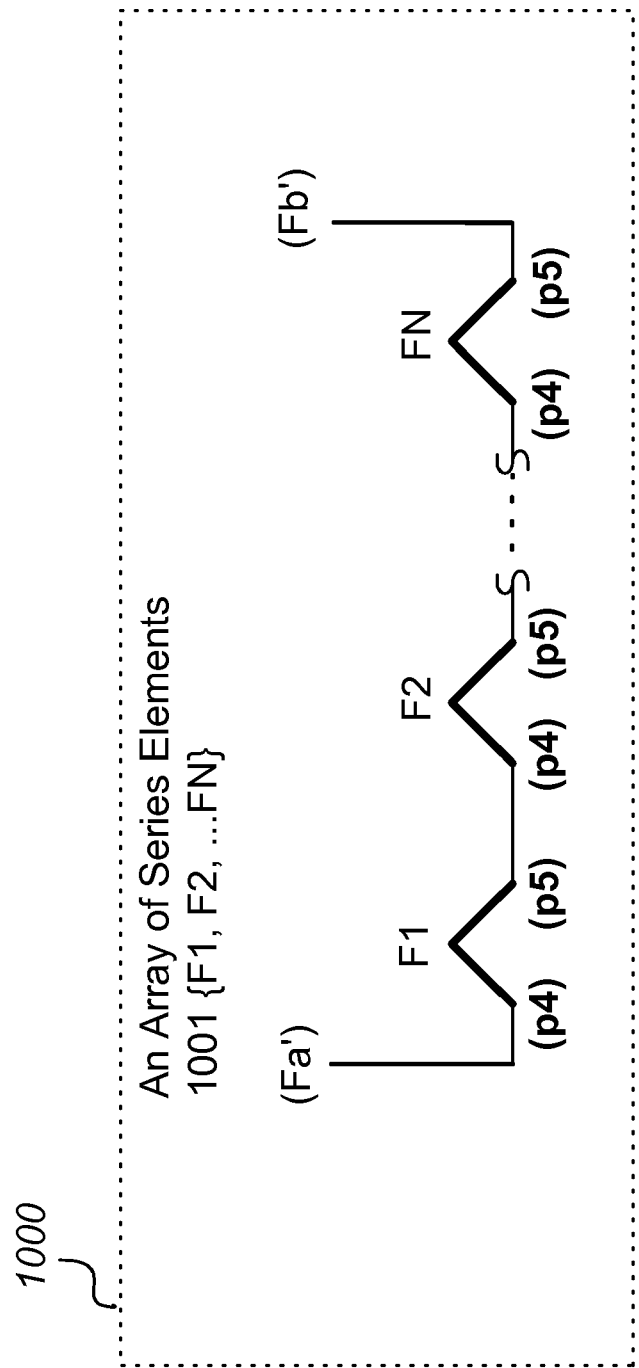
FIGS. 10A though 10C illustrate example coupling diagrams employed in filament supplies for various target amplifiers.
Figure 10B:
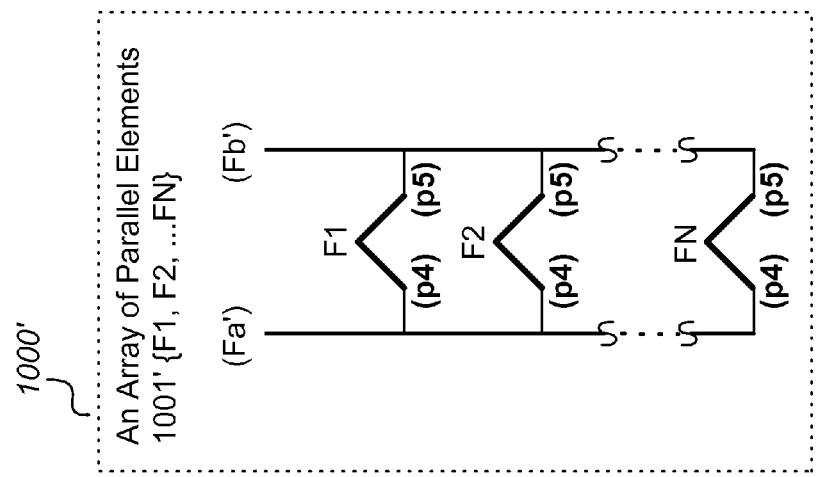

Example filament supply coupling schemes are illustrated in FIGS. 10A and 10B. As illustrated in FIG. 10A, an array of filaments (F1, F2 . . . FN) can be series coupled together (1000) between terminals Fa' and Fb'. As illustrated in FIG. 10B, the array of filaments (F1, F2 . . . FN) can also be parallel coupled together (1000') between terminals Fa' and Fb'. As will be described in further detail, the VTRD power input configuration means (330) can be arranged to allow both AC and DC filament current to pass between any of filament inputs (e.g., A, B, or CT) to any adjacently coupled filaments (for systems that utilize series coupled filament arrangements).

Many vacuum tube devices have filament elements that include center tap terminals. While FIGS. 10A and 10B demonstrate filament coupling without the use of a center tap, FIG. 10C demonstrates how a single filament may be arranged to utilize the center tap (1000"), and thus could be used in place of each filament arrangement previously described in FIGS. 10A and 10B. The VTRD power input configuration means (330) allows for continuous power delivery to a VTRD power conditioning means (340) and eventually to the VTRD amplifier means (310), regardless of the type of input power used (AC or DC) and independent of the power input filament supply coupling scheme (e.g., see FIGS. 10A-10C) utilized in the amplifier system, which provides a robust means of power delivery to the aggregate VTRD system.

The VTRD power conditioning means (340) may include one or more functions such as: voltage regulation, voltage limiting, current regulation, current limiting, ripple voltage filtering, ripple current filtering, and noise filtering to name a few functions. Example DC regulated supplies include both switching-type regulators and non-switching type regulators such as, for example, DC-DC converters, AC-DC inverters, series regulators, shunt regulators, LDO regulators, current-feedback regulators, voltage feedback regulators, to name a few. One example advantage of utilizing input power that is regulated, is the enhanced reduction in AC noise contribution (e.g., 60-cycle hum) that is frequently inherent in the target filament supply lines. This principle may be useful in other applications such as inline intermediate power supply conditioning systems for traditional vacuum tube filaments.

The VTRD power isolation means (350) may include optical, capacitive, magnetic (e.g., transformer), or other means to electrically isolate the power delivered to the VTRD amplifier means (see FIG. 3). The VTRD power isolation means (350) may be incorporated in a DC-DC converter or other power transfer interface. Particular advantages can be realized when utilizing an isolation barrier to deliver power to a high gain/high voltage amplification stage that incorporates high impedance supporting components for operation (e.g., see FIGS. 2A and 2B). One example advantage is the ability for the VTRD amplifier means (310) to use components that operate at considerably higher operating voltages than the VTRD power supply means (320), further reducing cost and increasing reliability of the VTRD power supply means (320). Another advantage is that the VTRD amplifier means (e.g., 310) is reference decoupled from the VTRD power supply means (320), thus allowing the resulting amplification stage (e.g., gain, follower, phase inverter, etc.) to have voltage, current, and power operating independence from the VTRD power supply means (320). Such advantages allow the resulting amplification stage to be used as a high voltage follower, where the VTRD amplifier cathode and plate may operate several hundred volts above the ground or the power supply reference, as one example. Yet another advantage is the ability to reduce common mode coupling from the VTRD power supply means (320) to the VTRD amplifier means (310), again minimizing the power supply noise contribution to the resulting amplifier gain stages, and ultimately enhancing the target amplifiers aggregate noise performance.

The VTRD power supply means (320) may also include current limiting, surge protection, and filtering functions, as well as other non-limiting power conditioning features. The various functional and/or physical partitions illustrated by FIG. 4 are merely intended to serve as example functional and/or physical partitions, and the various partitions may be separated or integrated into one or more different physical and or functional partitions.

Figure 5:
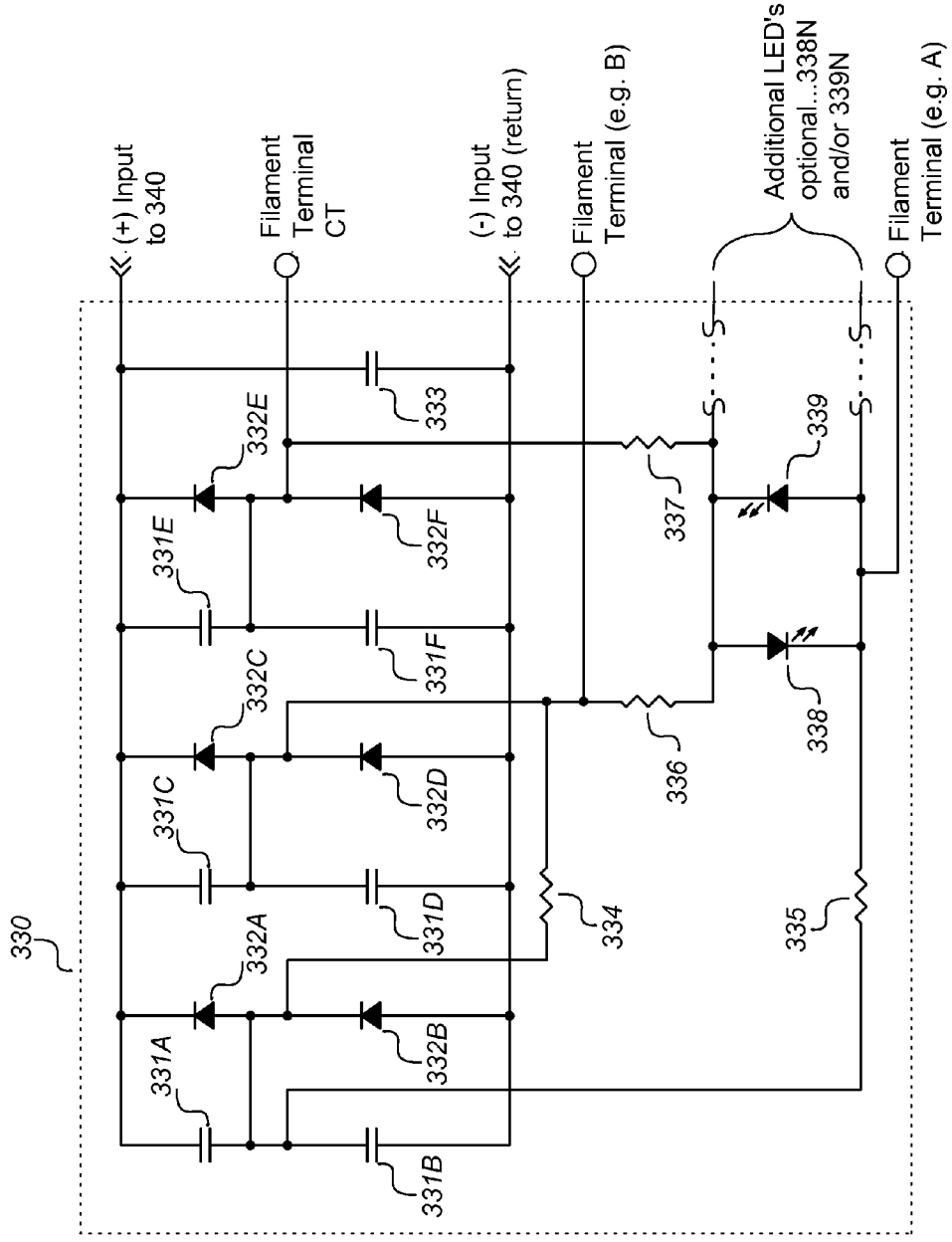
FIG. 5 illustrates an example VTRD power supply input configuration means.

FIG. 5 illustrates an example circuit for a VTRD power input configuration means (330) that is arranged according to the present disclosure. The VTRD power configuration circuit (330) includes diodes (332A-332D) for rectification of the filament supply from the A and B input terminals. Additional diodes (332E and 332F) that may be used to rectify the filament supply input from the center tap (CT) terminal for target amplifier applications that utilize center tap filament supply topologies.

Figure 10C:
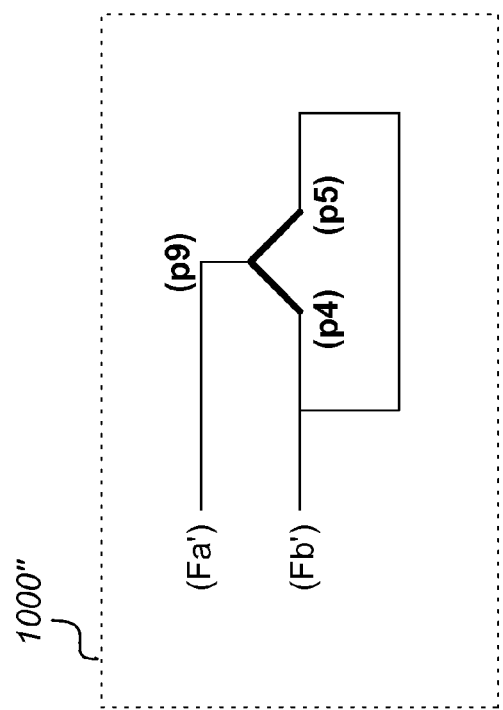

The diodes (332A-332F) are arranged to achieve bridge configuration operation for both series-coupled, parallel-coupled, series-coupled with CT, and parallel-coupled with CT filament supply arrangements, as previously described with respect to FIGS. 10A-10C. Each diode includes a corresponding bypass-balance capacitor (331A-331F), where the diode is coupled in parallel with the corresponding bypass-balance capacitor. Capacitors 331A-331F can provide significant reduction in the diode-switching transients of rectifier diodes 332A-332F, which may otherwise be transfer referred as common mode artifacts to the various amplifier stages. A post-rectification filter capacitor (333) may be included for additional AC ripple reduction. The example embodiment includes series pass resistors (334 and 335) which allow filament current to pass between filament power supply inputs A and B for applications that utilize series-coupled filaments as shown in example FIG. 10A.

LED circuits 338 and 339 are arranged in parallel with one another in opposite polarities to accommodate AC or DC indication of a target system applied filament power, and are current limited via resistor 336 for conditions where the filament supply current returns through filament input A or B. Resistor 337 allows for conditions where the filament supply current returns through the center tap for series pass current applications, LED illumination, and other non-limiting input configuration options. Additional LED's may be added in series and/or parallel configuration with LED's 338 and 339 for optional aesthetic purposes or to provide additional input supply advantages by increasing forward voltage loss/drop through the various LED circuits. LED circuits 338 and 339 may precede the rectifier established by diodes 332A-332F to reduce the ripple current requirement of filter capacitor 333. An advantage of ripple current reduction in the post-rectifier filter (333) is reduced size and cost of the filter capacitor (333).

Figure 6:
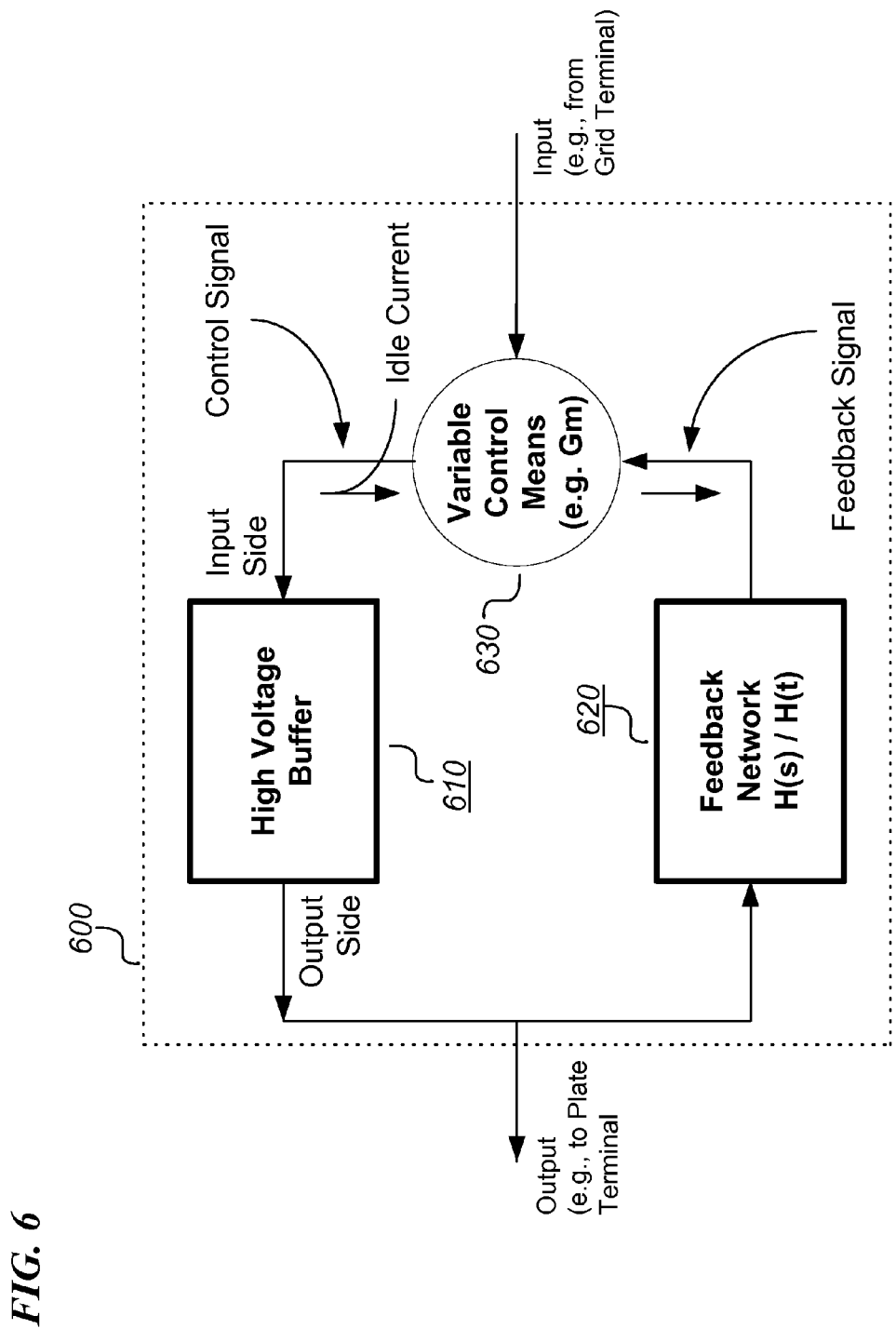
FIG. 6 illustrates an example of functional and/or physical partitions in a VTRD amplifier means.

FIG. 6 is an example illustration of a VTRD amplifier means (600), which includes a high voltage (HV) buffer (610), a feedback network (620), and a variable control means (630). The HV buffer (610) includes an input and an output. The feedback network (620) includes an input and an output. The variable control means includes a signal input, a feedback input, and an output. The output of the variable control means (630) provides a control signal that is coupled to the input of the HV buffer (610). The output of the HV buffer (610) is coupled to the output of the amplifier (600) and also coupled to the input of the feedback network (620). The output of the feedback network (620) provides a feedback signal that is coupled to the feedback input of the variable control means (630). An input signal to the amplifier (600) is received at the input of the variable control means, while an output signal for the amplifier (600) is provided at the output of the HV buffer (610) which is responsive to the control signal.

The circuit configuration depicted for the VTRD amplifier (600) is arranged to provide a self-biasing scheme that dynamically monitors the output side of the HV buffer (610), and adjusts the idle operating current through the variable control means (630). Typical idle current values range from 200 uA to 2 mA for preamp type tubes. The variable control means (630) may be, for example, a variably controllable voltage, current, impedance, and/or some other variably controlled parameter. The variable control means (630) may include a linear or non-linear transfer function. An example linear transfer function is mathematically demonstrated in example EQ1. An example non-linear transfer function is mathematically demonstrated in example EQ2.

$$Fvcm_{(input)} = Idss - \mu input \quad \text{EQ1}$$

Where Idss may be an intercept representing an offset current and μ may represent a current gain coefficient.

$$Fvcm_{(input)} = Idss - \mu(input)^{0.5} \quad \text{EQ2}$$

The variable control means (630) may be used to modulate current between the VTRD emulated cathode and VTRD emulated plate terminals via a high voltage (HV) buffer (610). The VTRD output may be coupled via external target amplifier components to successive target amplifier stages, and may include resistive, inductive, and other high voltage operable loads (e.g. 150V to 400V). Other example VTRD system loads may operate above or below the example voltage ranges cited. Example high voltage operating loads include resistor circuits, capacitive circuits, inductive and transformer circuits, vacuum tube and solid-state circuits, to name a few.

The output side of the HV buffer (610) can be used as the emulated plate terminal for a VTRD and may be coupled back to the variable control means (630) via a feedback network (620) to operate as a closed loop servo bias network for the aggregate system. The feedback network (620) is configured to provide a transfer function that can be a time domain [H(t)] transfer function, a frequency domain [H(s)] transfer function, or may embrace both types of transfer functions.

Several advantages are realized with the example VTRD amplifier (600) when utilizing a servo-biasing scheme. One advantage is that the bias operating point for the VTRD amplifier is achieved automatically and over a broader range of operating load parameters, such as load resistance and applied load voltage (B+), than would otherwise be realized without a servo bias implementation. This self-biasing scheme is especially useful in applications where the target amplifier circuit topology utilizes differential gain stage coupling arrangements or other self-biasing requirements. Another advantage is the reduction in tolerance dependencies in the VTRD amplifier components, as will be further described. The various functional and/or physical partitions illustrated by FIG. 6 are merely one example system, and the various partitions may be separated or integrated into one or more physical and/or functional partitions.

Figure 7:
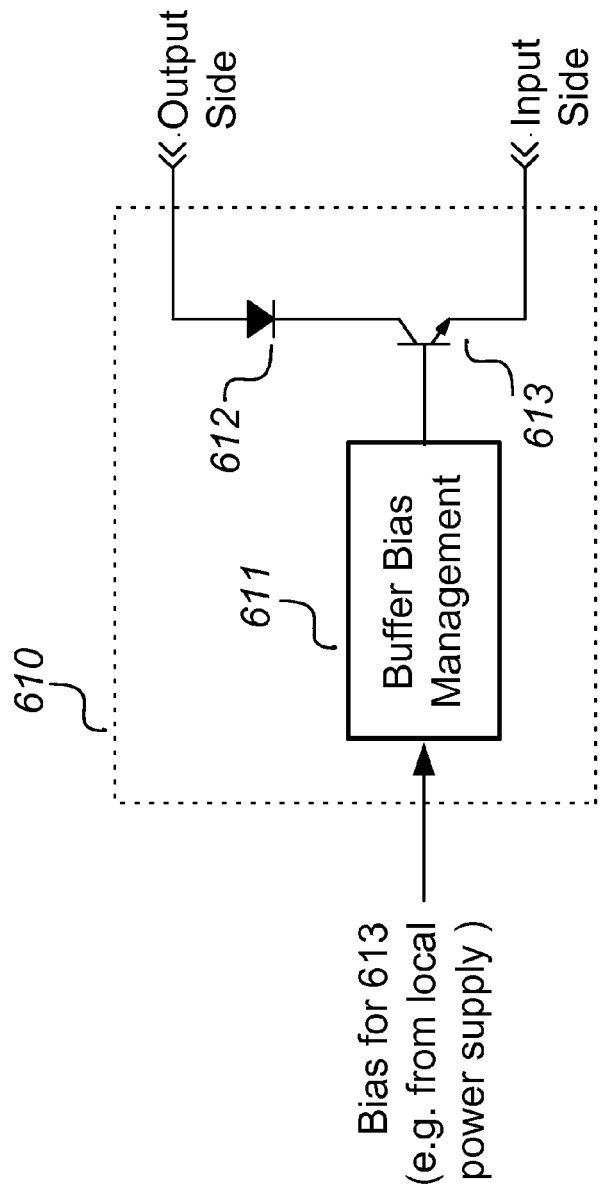
FIG. 7 illustrates an example high voltage buffer for a VTRD amplifier.

FIG. 7 illustrates an example high voltage buffer (610) for a VTRD amplifier that is arranged according to the present disclosure. High voltage (HV) buffer 610 includes an optional high voltage buffer bias management system (611), a buffer means (613) and an optional blocking means (612). The buffer means (613) is illustrated as a single buffer element, which in this case is a high voltage NPN transistor, to voltage isolate an output side of the HV buffer (610) from an input side of the HV buffer (610). It is expected that other high voltage components, such as MOSFET's or other devices may also be included in addition to, or replacing the example illustrated herein.

Figure 11:
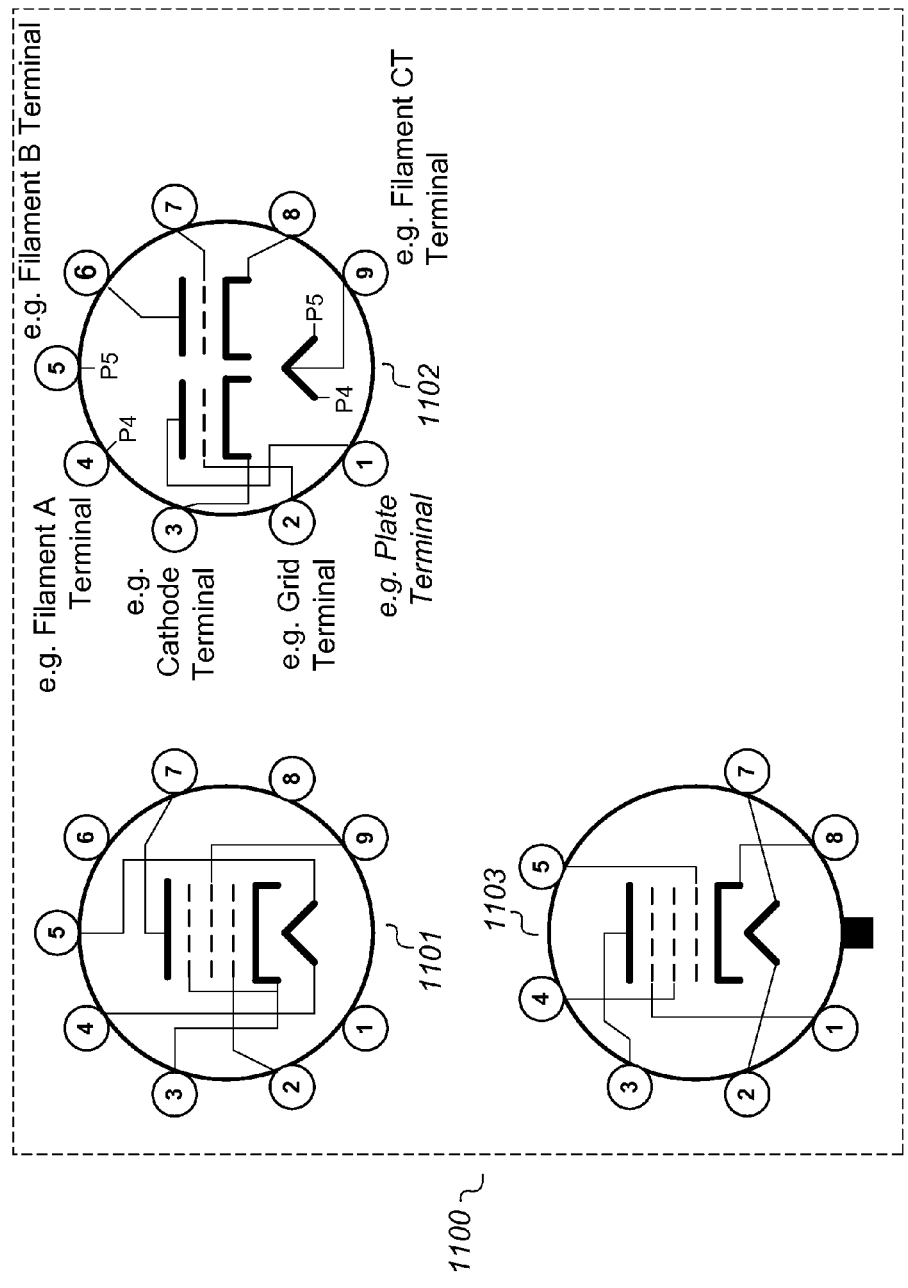
FIG. 11 illustrates example socket pin-configurations for example vacuum tube devices that are contemplated for direct pin-replacement structures.

In the present example embodiment, the buffer means (613) is arranged as a voltage follower and includes a HV buffer bias management system (611) which can be utilized to provide voltage and/or current biasing to assure proper conduction of the NPN transistor (the example buffer means, 613). The buffer means (613) operates as a voltage source to the input-side terminal of the HV buffer (610). The HV buffer bias management system (611) may derive power from the VTRD isolated power supply (e.g. 350) and may include additional filtering, regulation, or other bias conditioning desired for the buffer means 613. The buffer element may include a blocking means (612) between the VTRD emulated-plate terminal and the buffer mean (613). The blocking means (612) is illustrated as a diode, but other circuits may be utilized instead of the diode that provide similar function. The polarity of the diode may be arranged in such a manner as to alleviate burdensome current or power demand on the bias management system (611) for cases where the target amplifier system ground references the plate terminal for "unused" gain stages. The practice of grounding plate terminals in target amplification systems has been used for twin-triode vacuum tube arrangements. An example twin-triode vacuum tube arrangement (1102) is shown in FIG. 11.

The example buffer means (613) ideally will have a voltage rating above the highest expected voltage exposure at the VTRD emulated-plate terminal. In addition to voltage isolating/decoupling properties, the buffer means (613) can be used to current couple the buffer input to the buffer output. The input, or low voltage, side of the buffer means (613) may be coupled to a variable control means or a voltage-controlled current-modulating device such as a transconductance amplifier or JFET (unction field-effect-transistor). The output, or high voltage, side of the buffer means (613) may be coupled to the VTRD emulated-plate terminal directly or coupled to the emulated-plate terminal via blocking means such as diode (612), or other limiting components. The various functional and/or physical partitions illustrated by FIG. 7 are merely illustrative of one example high voltage buffer assembly, and the various partitions may be separated or integrated into one or more physical and/or functional partitions.

Figure 8A:
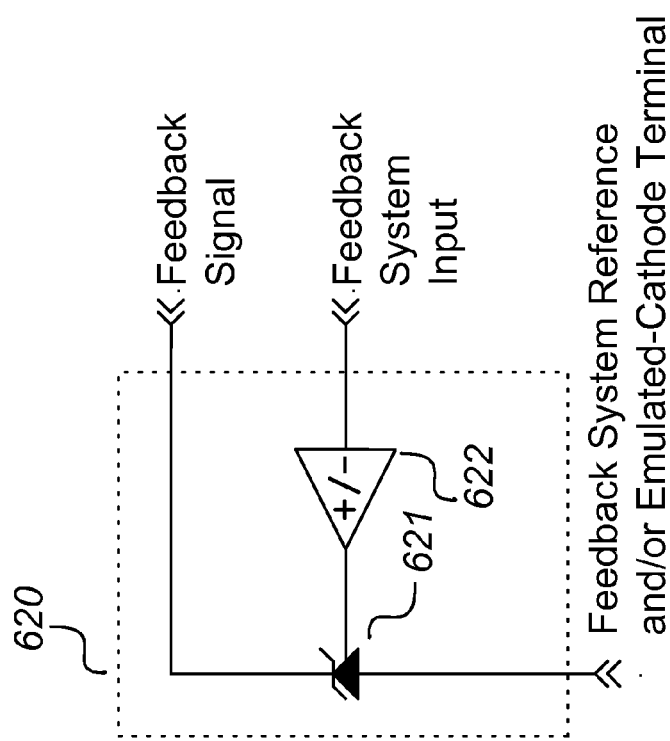
FIGS. 8A and 8B illustrate examples of various servo biasing feedback circuit arrangements.
Figure 8B:
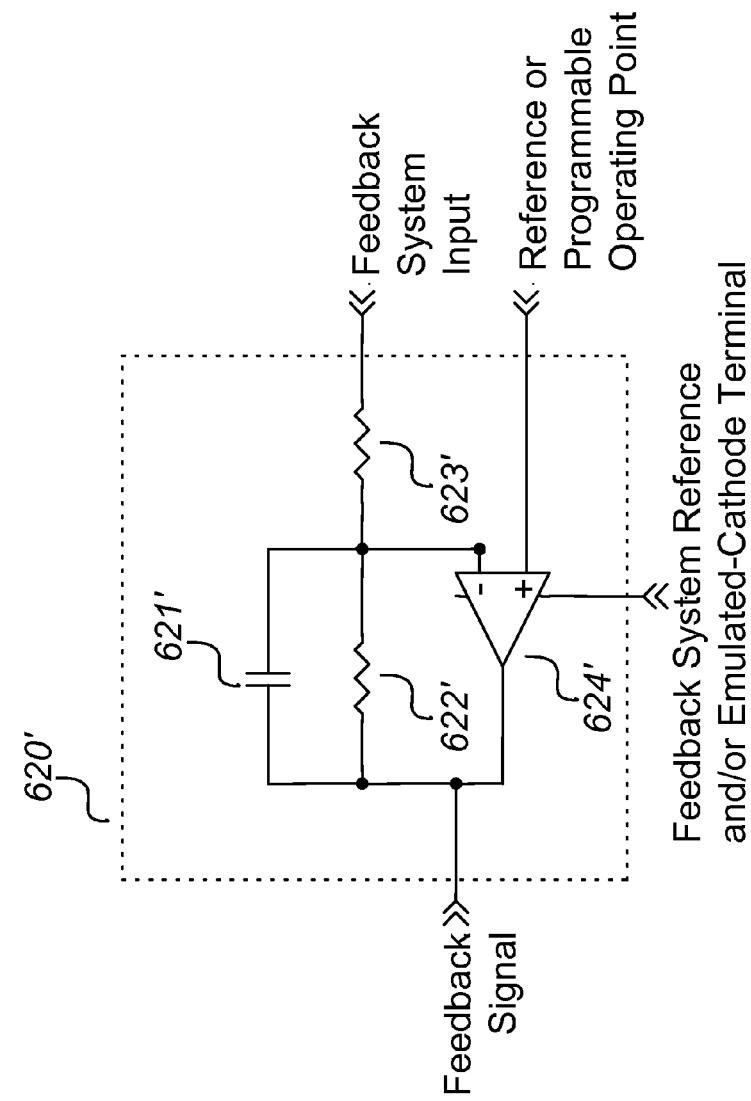

FIGS. 8A and 8B illustrate examples of various servo biasing feedback circuit arrangements (620, 620'). The depicted feedback arrangements may be implemented as time domain and/or frequency domain transfer feedback circuits that are configured to assist in achieving an auto-correcting servo bias feedback function in a VTRD amplifier.

Circuit 620 includes a bias circuit (621) and a buffer circuit (622). The output of buffer circuit 622 may be inverted or non-inverted from its feedback system input terminal. The output of the buffer circuit (622) may be coupled as an input control to the bias circuit (621), which may be a variable voltage, current, impedance, or other source (FIG. 8A depicts the bias circuit 621 as a controllable voltage source as an example). The bias circuit (621) may respond to changes based on VTRD operating parameters such as, for example, applied plate voltage (B+), quiescent operating current, delivered power, and/or other parameters sensed at the input of the buffer circuit (622). The output of the bias circuit (621) may be coupled as a compensating control to a VTRD gain, offset, voltage/current modulating, or other control circuit, such as a transconductance ($g_m$ amplifier stage, or other voltage, current, or impedance variable control system. Examples of such gain and/or control system functions have been described in FIGS. 6-630. The example bias circuit (621) may inclusively function as a VTRD plate-current return coupling method to the VTRD system reference or ground. The VTRD system reference or ground may also act as the emulated cathode terminal.

Circuit 620' is an example of an alternative VTRD servo bias feedback circuit implementation which includes a differential amplifier circuit such as op amp 624' that includes an example resistive feedback circuit (622') coupled between the op amp output and inverting input, an example capacitive bandwidth or phase compensating circuit (621') coupled between the op amp output and inverting input, and an example input sense resistor circuit (623') coupled from the op amp inverting terminal to a sense terminal such as the VTRD emulated-plate terminal, as one example sense point. The non-inverting terminal of the op amp may be coupled to a user programmable or fixed reference, which may be used to set a bias operating point for the VTRD amplifier system. Circuit 620' demonstrates an example feedback circuit which includes a buffering input function and a variable voltage source output function, thus integrating the two functions using a single op amp (624'). The example feedback circuits (620, 620') may acquire input signals from a VTRD amplifier output signal, VTRD emulated plate terminal, or other sources to assist in operational compensation for internal VTRD component tolerances, external VTRD plate impedance, applied plate voltage (B+), target amplifier stage-dependent biasing schemes, and/or other VTRD internal/external topology dependent parameters, to name a few. The servo feedback embodiment described is especially effective for achieving automatic VTRD bias point operating conditions independent of other operating parameters described herein. Example feedback circuits (620, 620') may utilize frequency domain and/or time domain transfer functions, which may include gain, offset, filtering, and/or modulating functional properties and/or characteristics. It is expected that the example servo bias feedback circuits (620, 620') may be implemented in a digital domain, such as a digital signal processing circuit, as well as being implemented with other analog solutions.

Figure 9A:
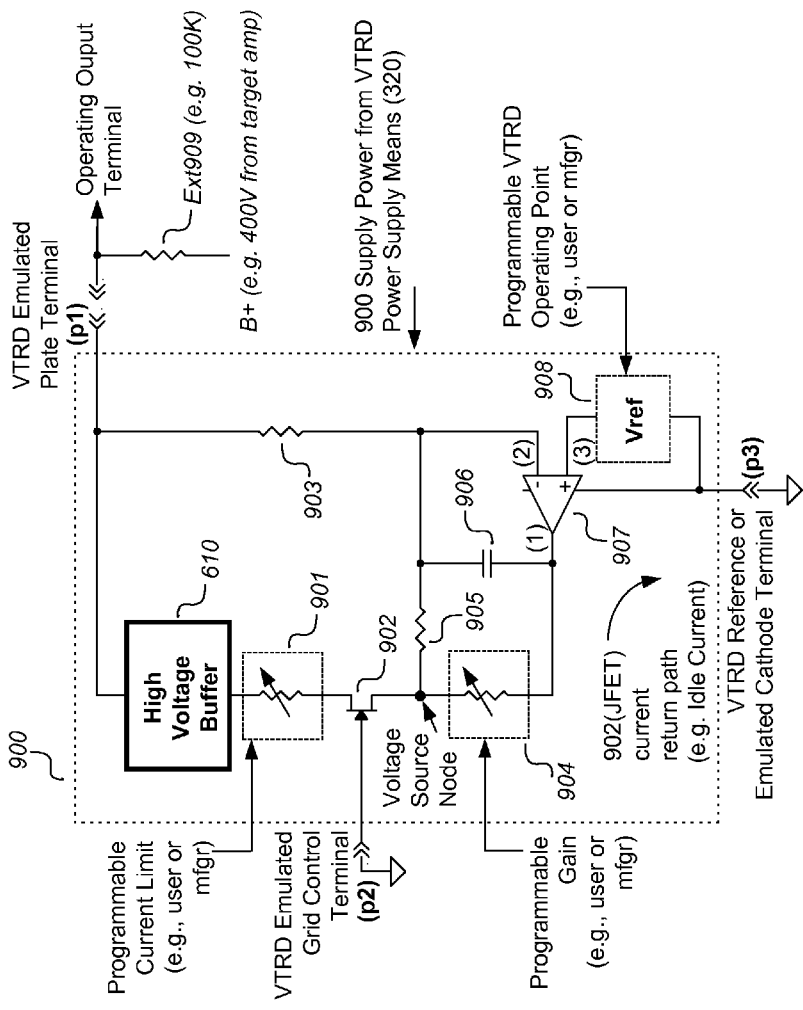
FIG. 9A illustrates an example VTRD amplifier circuit, which employs servo biasing and a high voltage buffer.

FIG. 9A is an example VTRD amplifier circuit (900) arranged according to at least one feature of the present disclosure. Circuit 900 includes HV buffer 610, resistors 901, 903 and 904, JFET 902, capacitor 906, differential amplifier 907, and voltage reference circuit 908.

JFET 902 is configured to operate as a transconductance input stage, with the JFET-drain circuit coupled to the input side of the HV buffer (610) via a fixed or programmable/adjustable current limiting circuit (depicted as a variable resistor, 901). The HV buffer (610) may provide a fixed voltage source, via the HV buffer bias system (611) follower element as described previously. The transconductance input stage (902) may include a fixed or programmable/adjustable gain setting circuit (depicted as a variable resistor, 904) as part of a VTRD system reference return path for the JFET (902)-source circuit. It is expected that the current limiting circuit (901) and/or gain setting circuit (904) may be user or manufacturer determined as optional VTRD configuration features.

A servo-bias feedback circuit may be employed comprising the differential amplifier (which can be an operational-amplifier or other gain stage, 907), a VTRD operating point biasing means, such as the voltage reference circuit (908), coupled to the non-inverting input (3) of the differential amplifier (907), a servo feedback bandwidth control circuit (906, depicted as a capacitor in this example) coupled between the inverting input (2) and the output (1) of the differential amplifier (907), a servo output feedback resistor circuit (905) coupled from the JFET-source to the differential amplifier inverting input (2), a gain setting return path resistor circuit (904) for the JFET (902) coupled from the JFET-source to the output (1) of the differential amplifier (907), and a sense input resistor circuit (903) coupled from the inverting input (2) of the differential amplifier (907) to a sensing source terminal, such as the VTRD amplifier emulated-plate terminal (p1). The VTRD amplifier emulated-plate terminal (p1) is driven by the output side of the HV buffer (610). The amplifier circuit (900) or portions thereof may be powered from a VTRD power supply means (e.g. 320).

For the following circuit descriptions of the VTRD amplifier circuit 900, it is assumed that the JFET input stage (902) is an N-channel type and the gate or emulated-grid terminal (p2) is at ground reference potential such as 0 volts. It is also assumed that the emulated-cathode terminal (p3) is at the ground reference potential. It is further assumed that the emulated-plate terminal (p1) is coupled to a load circuit (Ext909) connected to a B+ (Bplus) supply voltage source, the preceding junction of which comprises a VTRD output operating terminal (p1). The HV buffer voltage source magnitude is arranged to operate the JFET (902) channel in the saturation-region, thus yielding a linear operating region for the JFET-gate/source (902) operating above the gate-threshold-cutoff voltage (normally denoted as Vgs in JFET manufacturer specifications). The analysis described below further assumes that JFET 902, differential amplifier 907, and HV buffer means 610 are ideal and non-lossy. These assumptions are defined for explanation and demonstrative purposes specifically for the examples given.

The IR drop across the load circuit Ext909 establishes the output voltage at terminal p1 which is given by Vp1=Bplus−(I*Ext909). The current through the load circuit Ext909 is the sum of currents through resistor circuits 901 and 903. The current through resistor circuit 903 is given by I903=(Bplus−Vref)/R903. The current through resistor circuit 901 is determined by the voltage at the VSnode for JFET 902 and is given by the first order linear equation I902=Idss+(μ*VSnode), where Idss represents the saturation current for JFET 902 and μ (mu) represents the transconductance or current gain of JFET 902. It should also be noted at this point that the current through resistor circuit 903 equals the current through resistor circuit 905 and the current through resistor circuit 904 equals the sum of currents through resistor circuits 901 and 903. I.e., the current through resistor circuit 904 is equivalent to the total current through the load circuit (Ext909) and is reflected in the current flowing out of terminal p3 via amplifier circuit 907.

The voltage at the differential amplifier (907) inverting terminal (2) is equal to Vref. The node at the JFET 902 source is a voltage source since the feedback sense point for the differential amplifier circuit 907 is obtained from this point, thus the label voltage-source-node or VSnode. I.e., the differential amplifier circuit 907 will drive the VSnode to the voltage value required in order to make 907 (2)=907 (3), regardless of the value of the resistor circuit 904, and this conditions remains accurate as long as the value for resistor circuit 904 allows operation within the dynamic output limits for amplifier circuit 907. As such, the voltage at the VSnode is given by VSnode=Vref−IR905.

The following terms will be used for the mathematical analysis of circuit 900: Vo is the voltage output of the VTRD at terminal p1, otherwise denoted as the operating output terminal, Vb is the B+ (Bplus) voltage source, Rp is the external load circuit (Ext909) shown as a resistor circuit in these examples, Idss is the JFET (902) saturation current, μ (mu) is the transconductance gain coefficient for JFET 902, Vr is the reference voltage at 907 terminal (3) via voltage reference 908, Ri is the sense input resistance represented by resistor circuit 903, and Rf if feedback resistance circuit represented by resistor circuit 905. As should be noted as part of the novelty of this disclosure, resistor circuit 904 (JFET 902 gain) and resistor circuit 901 (JFET 902 current limit) operate independent of the closed-loop servo bias system transfer function, restricted to limitations of the individual component operating specifications and VTRD system power supply limitations. The principle description for the system shown in FIG. 9A pertains to the acquisition of the static condition bias point for which the AC signal operating parameters are superimposed.

Based on the conditional dependencies described for circuit 900, the following DC transfer function is shown as equation EQ3:

$$Vo = Vb - Rp\left[Idss - \mu\left(Vr - Rf\left\{\frac{Vo - Vr}{Ri}\right\}\right)\right] + Rp\left(\frac{Vo - Vr}{Ri}\right) \quad \text{EQ 3}$$

Multiplying through the terms in EQ3 and isolating the output term Vo yields equation EQ4:

$$Vo = \frac{Vb - RpIdss + \mu RpVr + \frac{\mu RpRf}{Ri}Vr - \frac{Rp}{Ri}Vr}{1 + \frac{\mu RpRf}{Ri} - \frac{Rp}{Ri}} \quad \text{EQ 4}$$

Further simplifying EQ4 for common terms gives the final DC transfer function equation for circuit 900 in EQ5.

$$Vo = \frac{Vb - Rp\left[Idss - \mu Vr\left(1 + \frac{Rf}{Ri}\right) + \frac{Vr}{Ri}\right]}{1 + \frac{Rp}{Ri}(\mu Rf - 1)} \quad \text{EQ 5}$$

Figure 9B:
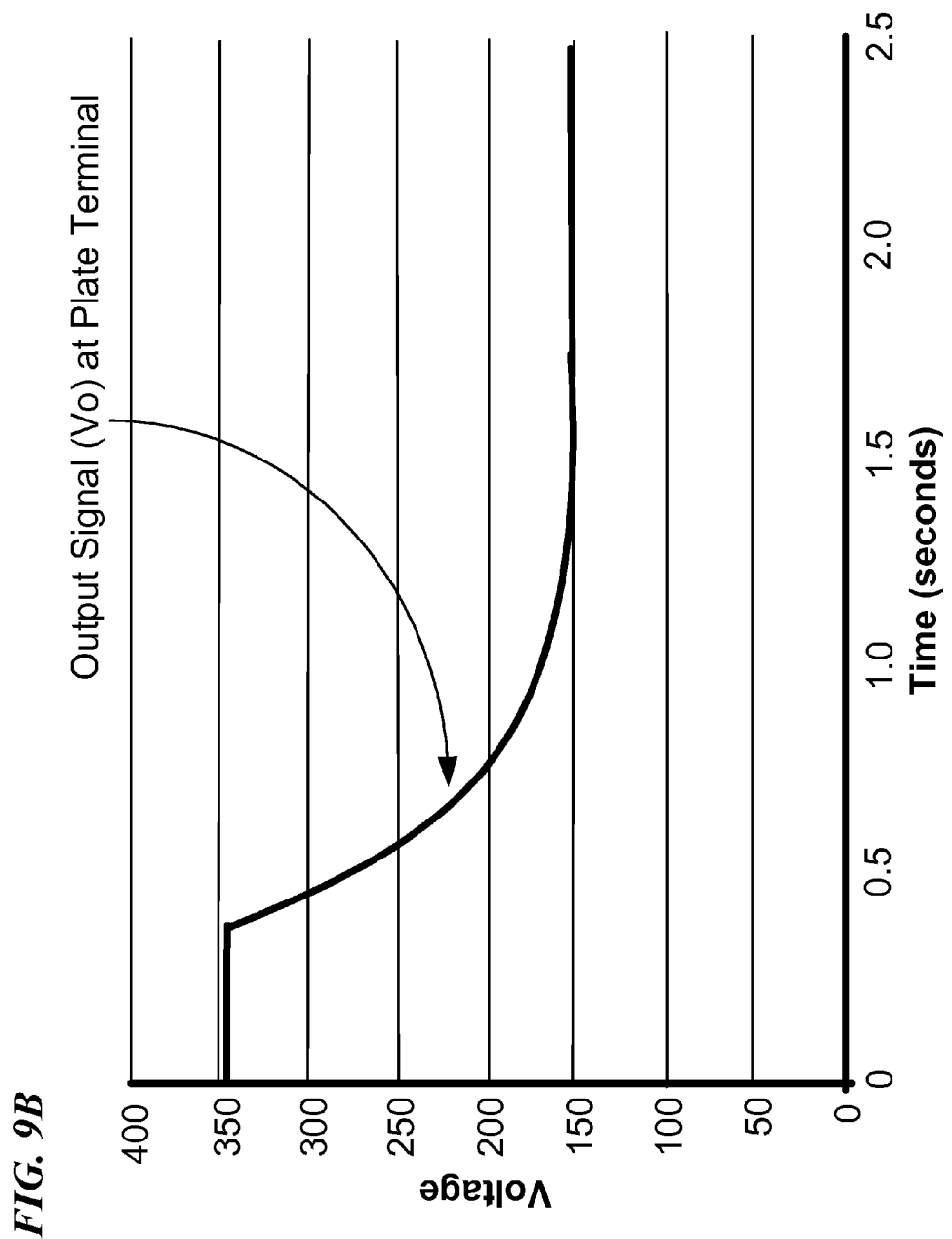
FIG. 9B is a graphical illustration of a transient response for an output signal (Vo) for an example VTRD that is provided at a plate terminal (p1) when a step voltage is applied to the B+ terminal.

FIG. 9B is a graphical illustration of a transient response for an output signal (Vo) for an example VTRD that is provided at a plate terminal (p1) when a step voltage is applied to the B+ terminal. For this example transient response, the voltage at the B+ step terminal steps from zero to +350V. The graph of FIG. 9B has a left ordinate representing Vo (volts) and an abscissa representing time (seconds). The origin is in the lower left corner of the two-dimensional graph plane. The solid graph line represents an example VTRD system response at plate terminal (p1) when a +350V B+ step is applied via Ext909.

Several advantages are realized by the VTRD amplifier embodiment described herein. One advantage is minimal parasitic circuit contamination to the JFET-gate transconductance input stage (902) via other emulated-grid coupled biasing schemes or other circuits. Alternate VTRD control or biasing schemes that include coupling to the input emulated-grid terminal may produce decreased input impedance or increased input capacitance for example. The present embodiment increases the emulated performance of the VTRD grid input circuit, thus more closely matching traditional vacuum tube input circuit parameters.

Another non-obvious advantage is achieved in the present embodiment, which includes an expanded VTRD output dynamic range by the reduction of quiescent operating current being derived from the B+ supply. Because the VTRD system described herein employs the use of a VTRD power supply (320), which derives power from the target amplifier filament supply rather than the target amplifier B+ supply, active circuit functions in the VTRD amplifier may be employed without drawing current through the target amplifiers plate load. Drawing current through the target amplifiers plate load would otherwise create a voltage drop across the plate load which directly impacts and subtracts from the available voltage range supplied by the target amplifier B+ high voltage supply. The circuit topology illustrated by FIG. 9A is merely one example and it is foreseen that other circuit topologies may be employed to achieve identical or similar functionality.

Example standard vacuum tube pin arrangements are illustrated in FIG. 11 Example (1101) illustrates a 9 pin pentode such as an EL84/6BQ5. Example (1102) illustrates a 9 pin dual (twin) triode such as a 12AX7 or 6CA7. Example (1103) illustrates a keyed 7 pin pentode in an "octal arrangement" or 7-pin octal, such as an EL34, 6V6, or 6550.

Example preamplifier devices include 12AX7/ECC83/7025/5751 style preamplifier vacuum tubes, 12AU7/12BH7/ECC99/6191/ECC82 style preamplifier vacuum tubes, 12AT7/6201/ECC81 style preamplifier vacuum tubes, 6DJ8/ECC88/6922/ECC88 style preamplifier vacuum tubes, 12AY7 preamplifier vacuum tubes, 6N1P/6H30/6C45PI type preamplifier vacuum tubes, to name a few. Example data sheets associated with preamplifier vacuum tubes, including pin arrangements, are illustrated in Appendix A.

Example power-amplifier devices include 6BQ5/EL84/7189/SV83/6P14P/6P15P style power-amplifier vacuum tubes, 6550/KT88/KT90 style power-amplifier vacuum tubes, 6CA7/EL34 style power-amplifier vacuum tubes, 6L6/5881/KT66/7027 style power-amplifier vacuum tubes, and 6V6GTA/7408 style power-amplifier vacuum tubes. Example data sheets associated with power-amplifier vacuum tubes, including pin arrangements, are illustrated in Appendix B.

Although the invention has been described herein by way of example embodiments, variations in the structures and methods described herein may be made without departing from the spirit and scope of the invention. For example, the positioning of the various functions and components may be varied. Individual components and arrangements of components may be substituted as will be appreciated by one skilled in the art having read the instant disclosure. Since many embodiments of the invention can be made without departing from the spirit and scope of the invention, the invention is not limited except as by the appended claims.

What is claimed is:

1. A vacuum tube replacement device that is arranged for use in a vacuum tube socket that includes a plate terminal, a grid terminal, a cathode terminal, and two filament terminals, the vacuum tube replacement device comprising:
   a power supply means that is arranged to generate a local power supply from two filament terminals associated with the vacuum tube socket; and
   an amplifier means that is operated from the local power supply to generate a first signal at the plate terminal and a second signal at the cathode, wherein the first and second signals are responsive to an input signal received from the grid terminal, the amplifier means comprising:
      a variable control means that includes a first input that is coupled to the grid terminal, a second input that is arranged to receive a feedback signal, and an output terminal that is arranged to provide a control signal in response to the feedback signal and the input signal;
      a feedback network that is coupled between the plate terminal and the second input of the variable control means, wherein the feedback network is arranged to provide the feedback signal; and
      a high voltage buffer that is coupled to the plate terminal and responsive to the control signal, wherein the high voltage buffer is automatically biased, wherein the variable control means is configured such that an idle current associated with the high voltage buffer is dynamically adjusted according to a self-biasing scheme.

2. The vacuum tube replacement device of claim 1, wherein the tube replacement device is arranged in a standard vacuum tube pin configuration, wherein the standard vacuum tube pin configuration corresponds to either a pre-amplifier tube, a power-amplifier tube, and a combined pre-amplifier/power-amplifier tube, a 9 pin pentode, a 9 pin dual triode, a 7 pin pentode, and a 7-pin octal.

3. The vacuum tube replacement device of claim 1, the power supply means comprising either: a rectification means, a regulation means, or a filtering means.

4. The vacuum tube replacement device of claim 1, wherein the functions of the power supply means and the amplifier means are combined in a single circuit.

5. The vacuum tube replacement device of claim 1, wherein the power supply means is isolated from the amplifier means.

6. The vacuum tube replacement device of claim 1, wherein the power supply means is arranged to generate the local power supply from the two filament terminals.

7. The vacuum tube replacement device of claim 6, wherein the two filament terminals are associated with either an AC filament voltage or a DC filament voltage.

8. The vacuum tube replacement device of claim 1, the power supply means comprising a power input configuration means.

9. The vacuum tube replacement device of claim 8, the power input configuration means comprising either a means for rectifying AC filament input power or a means for utilizing DC filament input power.

10. The vacuum tube replacement device of claim 8, the power input configuration means comprising either a rectifier or an AC/DC converter.

11. The vacuum tube replacement device of claim 8, the power input configuration means comprising either a voltage divider or a DC/DC converter.

12. The vacuum tube replacement device of claim 1, wherein the filament terminals for the vacuum tube socket are coupled to other vacuum tube sockets in a configuration comprising either a series configuration or a parallel configuration.

13. The vacuum tube replacement device of claim 1, the power supply means comprising a power conditioning means.

14. The vacuum tube replacement device of claim 13, the power conditioning means comprising either a means for voltage regulating, a means for voltage limiting, a means for current regulating, a means for current limiting, a means for ripple voltage filtering, or a means for noise filtering.

15. The vacuum tube replacement device of claim 13, the power conditioning means comprising either a DC-DC converter, an AC-DC inverter, a series regulator, a shunt regulator, a low drop-out (LDO) regulator, a current-feedback regulator, or a voltage feedback regulator.

16. The vacuum tube replacement device of claim 1, the power supply means comprising a power supply isolation means.

17. The vacuum tube replacement device of claim 16, the power supply isolation means comprising either an optical isolator means, a capacitive isolator means, or a magnetic isolator means.

18. The vacuum tube replacement device of claim 1, the power supply means comprising:
   a first diode circuit that is coupled between a first local supply terminal and a common node;
   a second diode circuit that is coupled between the common node and a second local supply terminal;
   a first resistor that is coupled between the common node and a first one of the two filament terminals; and
   a second resistor that is coupled between the common node and a second one of the two filament terminals.

19. The vacuum tube replacement device of claim 18, each of the first diode circuit and the second diode circuit comprising: a diode coupled in parallel with a capacitor.

20. The vacuum tube replacement device of claim 18, the power supply means further comprising: a light emitting diode that is coupled between the two filament terminals such that a light is emitted when power is applied across the two filament terminals.

21. The vacuum tube replacement device of claim 18, the power supply means further comprising:

a third diode circuit that is coupled between the first local supply terminal and the first one of the two filament terminals; and a fourth diode circuit that is coupled between the first one of the two filament terminals and the second local supply terminal.

22. The vacuum tube replacement device of claim 21, each of the third diode circuit and the fourth diode circuit comprising: a diode coupled in parallel with a capacitor.

23. The vacuum tube replacement device of claim 18, the power supply means further comprising:

a third diode circuit that is coupled between the first local supply terminal and a center tap filament terminal of the vacuum tube socket;

a fourth diode circuit that is coupled between the center tap filament terminal and the second local supply terminal; and a third resistor that is coupled between the center tap filament terminal and the first one of the two filament terminals.

24. The vacuum tube replacement device of claim 23, each of the third diode circuit and the fourth diode circuit comprising: a diode coupled in parallel with a capacitor.

25. The vacuum tube replacement device of claim 1, wherein the amplifier means is arranged for responsive operation from a screen terminal that is associated with vacuum tube socket.

26. The vacuum tube replacement device of claim 1, wherein the amplifier means is arranged for automatic biasing as an inverting gain stage.

27. The vacuum tube replacement device of claim 1, wherein the amplifier means is arranged for automatic biasing as a non-inverting gain stage.

28. The vacuum tube replacement device of claim 1, wherein the amplifier means is arranged for automatic biasing as a buffer stage.

29. The vacuum tube replacement device of claim 1, wherein the amplifier means is arranged for automatic biasing as a cathode follower.

30. The vacuum tube replacement device of claim 1, wherein the amplifier means is arranged for automatic biasing as a phase inverter.

31. The vacuum tube replacement device of claim 1, wherein the functions of the variable control means, the feedback network and the high voltage buffer are combined in a single circuit.

32. The vacuum tube replacement device of claim 1, wherein the variable control means is arranged to operate according to either a linear transfer function or a non-linear transfer function.

33. The vacuum tube replacement device of claim 1, wherein the feedback network is configured to provide either a time domain transfer function, a frequency domain transfer function, or a combined time and frequency domain transfer function.

34. The vacuum tube replacement device of claim 1, the feedback network comprising either passive components, active components, or a combination of active and passive components.

35. The vacuum tube replacement device of claim 1, the feedback network comprising: a buffer circuit and a bias circuit, wherein the bias circuit is coupled between a feedback system reference and a feedback system output, wherein the bias circuit is controlled by the buffer circuit in response to changes in an operating condition of the vacuum tube replacement device, wherein the operating condition comprises either: applied plate voltage, quiescent operating current, or delivered power.

36. The vacuum tube replacement device of claim 1, the feedback network comprising: a differential amplifier circuit, a feedback resistor and an input sense resistor, wherein the sense resistor is arranged to couple a feedback input to an input of the differential amplifier circuit, wherein the feedback resistor is coupled between the input of the differential amplifier circuit and an output of the differential amplifier circuit, wherein the output of the differential amplifier circuit corresponds to a feedback output.

37. The vacuum tube replacement device of claim 36, wherein the feedback network is further arranged to be referenced to a voltage associated with the cathode terminal of the vacuum tube socket.

38. The vacuum tube replacement device of claim 36, the feedback network further comprising a compensation capacitor that is coupled in parallel with the feedback resistor.

39. The vacuum tube replacement device of claim 1, the high voltage buffer comprising a buffer means and a high voltage biasing means that is arranged to dynamically bias the buffer means such that the idle current associated with the buffer means is adjusted.

40. The vacuum tube replacement device of claim 1, the high voltage buffer comprising: a bipolar junction device that includes an emitter that is associated with an input of the high voltage buffer, a collector that is associated with an output of the high voltage buffer, and a base that is associated with a biasing adjustment input of the high voltage buffer.

41. The vacuum tube replacement device of claim 40, wherein the collector of the bipolar junction device is coupled to the output of the high voltage buffer through a blocking means.

42. The vacuum tube replacement device of claim 1, the high voltage buffer comprising: a field effect device that includes a source terminal that is associated with an input of the high voltage buffer, a drain terminal that is associated with an output of the high voltage buffer, and a gate that is associated with a biasing adjustment input of the high voltage buffer.

43. The vacuum tube replacement device of claim 1, the amplifier means comprising: a transistor device that includes a first conduction terminal, a second conduction terminal, and a control terminal, wherein the control terminal is coupled to the grid terminal of the vacuum tube socket, the first conduction terminal is coupled to the plate terminal of the vacuum tube socket via the high voltage buffer, and the second conduction terminal is coupled to a voltage source node, wherein conduction between the first conduction terminal and the second conduction terminal is controlled by applying a control voltage to the control terminal.

44. The vacuum tube replacement device of claim 43, wherein the transistor device comprises either a field effect transistor or a bipolar junction transistor.

45. The vacuum tube replacement device of claim 43, wherein the feedback network and the variable control means are arranged in cooperation with one another such that a voltage associated with the control terminal of the transistor device is responsive to changes in an idle voltage associated with the plate terminal of the vacuum tube socket.

46. The vacuum tube replacement device of claim 43, wherein the feedback network and the variable control means are arranged in cooperation with one another such that a voltage associated with the control terminal of the transistor device is responsive to changes in an idle voltage associated with the cathode terminal of the vacuum tube socket.

47. The vacuum tube replacement device of claim 43, wherein the feedback network and the variable control means are arranged in cooperation with one another such that a voltage associated with the control terminal of the transistor device is responsive to changes in an idle voltage associated with the plate terminal of the vacuum tube socket and another idle voltage associated with the cathode terminal of the vacuum tube socket.

48. The vacuum tube replacement device of claim 43, wherein the feedback network and the variable control means are arranged in cooperation with one another such that a voltage associated with the control terminal of the transistor device is responsive to previously programmed inputs.

49. The vacuum tube replacement device of claim 43, wherein the coupling between the control terminal and the first conduction terminal comprises either: a bipolar junction device, a field effect device, or a combination of a bipolar junction device and a field effect device.

50. The vacuum tube replacement device of claim 43, wherein the coupling between the control terminal and the second conduction terminal comprises either: a bipolar junction device, a field effect device, or a combination of a bipolar junction device and a field effect device.

51. The vacuum tube replacement device of claim 43, further comprising a current limiting means that is arranged to limit a peak current associated with either the first conduction terminal, the second conduction terminal, or the first and second conduction terminals for the transistor device.

52. The vacuum tube replacement device of claim 43, further comprises a gain setting means that is arranged for selectively adjusting a gain characteristic associated with the amplifier means.

53. A vacuum tube replacement device that is arranged for use in a vacuum tube socket that includes a plate terminal, a grid terminal, a cathode terminal, and two filament terminals, the vacuum tube replacement device comprising:

a terminal assembly that is arranged to engage the vacuum tube socket at the plate terminal, the grid terminal, the cathode terminal, and the two filament terminals;

a housing that is coupled to the terminal assembly and arranged such that the combination of the housing and the terminal assembly has an appearance similar to a conventional vacuum tube; and a solid-state circuit that is coupled to the terminal assembly when enclosed in the housing, the solid-state circuit comprising:

a power supply circuit that is arranged to generate a local power supply from two filament terminals associated with the vacuum tube socket;

a solid-state transconductance input stage that includes a first conduction terminal, a second conduction terminal, and a control terminal, wherein the control terminal is coupled to the grid terminal of the vacuum tube socket;

a high-voltage buffer circuit that includes a transistor circuit and a high-voltage buffer bias circuit, wherein the transistor circuit is coupled between the plate terminal and the first conduction terminal, and the high-voltage buffer bias circuit is operated from the local power supply and arranged to bias the transistor circuit such that the transistor circuit reduces the voltage between the plate terminal and the first conduction terminal such that an idle current associated with the high voltage buffer circuit is automatically adjusted in response to changes in the plate voltage;

a voltage reference circuit that is arranged to provide a reference voltage referenced relative to the cathode terminal;

a feedback circuit that is coupled between the plate terminal and the second conduction terminal of the solid-state transconductance input stage; and a differential amplifier circuit that includes a first input coupled to the voltage reference circuit, a second input coupled to the plate terminal through the feedback circuit, and an output that is coupled to the second conduction terminal through the feedback circuit.

54. A method for a vacuum tube replacement device that is arranged for use in a vacuum tube socket that includes a plate terminal, a grid terminal, a cathode terminal, and two filament terminals, the method comprising:

generating a local DC power supply with a solid-state circuit that is coupled to the two filament terminals in the vacuum tube replacement device;

sensing the local DC power supply voltage and adjusting at least a portion of a control voltage in response thereto;

adjusting a voltage drop from the plate terminal to a first conduction terminal with a first transistor buffer circuit that is responsive to the control voltage such that a voltage associated with the plate terminal is comparable to a plate voltage for a conventional vacuum tube device;

associated a current flow between the first conduction terminal and a second conduction terminal with a solid-state transconductance input stage, wherein a control terminal for the solid-state transconductance input stage is coupled to the grid terminal of the vacuum tube socket;

generating a reference voltage relative to the cathode terminal with a voltage reference circuit; and automatically adjusting a voltage associated with the second conduction terminal with a servo-bias feedback circuit that includes a differential amplifier circuit, a first feedback circuit, and a second feedback circuit, wherein the differential amplifier circuit is arranged to compare the reference voltage to a sense voltage, wherein the sense voltage is determined by the first feedback circuit and the second feedback circuit, wherein the first feedback circuit is coupled between the plate terminal and an output of the differential amplifier circuit, and the second feedback circuit is coupled between the output of the differential amplifier circuit and the second conduction terminal.

\* \* \* \* \*

UNITED STATES PATENT AND TRADEMARK OFFICE
CERTIFICATE OF CORRECTION

PATENT NO. : 7,408,401 B1
APPLICATION NO. : 11/678562
DATED : August 5, 2008
INVENTOR(S) : Douglas H. Roberts It is certified that error appears in the above-identified patent and that said Letters Patent is hereby corrected as shown below:

Column 9, Line 7: "JFET (unction field-effect-transistor)." should read --JFET (junction field-effect-transistor).--

Column 9, Line 36: "transconductance ($g_m$" should read --transconductance ($g_m$)--

Column 9, Line 39: "FIGS. 6-630." should read --FIG. 6-630.--

Signed and Sealed this

Seventeenth Day of March, 2009

JOHN DOLL
*Acting Director of the United States Patent and Trademark Office*